United States Patent
Hirabayashi

(10) Patent No.: US 6,865,102 B1
(45) Date of Patent: Mar. 8, 2005

(54) STATIC SEMICONDUCTOR STORAGE DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/788,372

(22) Filed: Mar. 1, 2004

(30) Foreign Application Priority Data

Aug. 20, 2003 (JP) .................................... P2003-296414

(51) Int. Cl.[7] ............................................. G11C 11/00
(52) U.S. Cl. ...................................... 365/154; 365/156
(58) Field of Search ................................ 365/154, 156

(56) References Cited

U.S. PATENT DOCUMENTS

| | | | |
|---|---|---|---|
| 5,418,740 A | 5/1995 | Sasaki | |
| 5,973,984 A | * 10/1999 | Nagaoka | ..................... 365/154 |
| 6,665,209 B2 | * 12/2003 | Osada et al. | ................. 365/156 |
| 6,714,478 B2 | * 3/2004 | Tomita et al. | .............. 365/154 |
| 6,795,368 B2 | * 9/2004 | Iwahashi et al. | ............ 365/154 |

OTHER PUBLICATIONS

Kevin Zhang, et al., "The Scaling of Data Sensing Schemes for High speed Cache Design in Sub–0.18μm Technologies", 2000 Symposium on VLSI Circuits Digest of Technical Papers, 2000, pp. 226–227.

* cited by examiner

Primary Examiner—Trong Phan
(74) Attorney, Agent, or Firm—Oblon, Spivak, McClelland, Maier & Neustadt, P.C.

(57) ABSTRACT

A static semiconductor storage device is described. This device includes a plurality of word lines, a plurality of first and second bit lines and memory cells. The word lines extend in a row direction. The first bit lines extend in a column direction. The second bit lines extend in the column direction and are paired. The memory cells are connected to the word lines by each row as well as to the pairs of second bit lines by each column. The memory cells of the same column share the first bit line and are controlled to electrically couple with the second bit line thereof at different times.

22 Claims, 3 Drawing Sheets

STATIC SEMICONDUCTOR STORAGE DEVICE

CROSS-REFERENCE TO RELATED APPLICATIONS

This application is based upon and claims the benefit of priority from the prior Japanese Patent Application No. 2003-296414, filed on Aug. 20, 2003, the entire contents of which are incorporated herein by reference.

FIELD OF THE INVENTION

The present invention relates to a static semiconductor storage device, and more particularly to a static semiconductor storage device including memory cells of transistors.

BACKGROUND OF THE INVENTION

A static random access memory (hereinafter, referred to as SRAM) is known as a type of static semiconductor storage devices.

In SRAMs, memory cells having, for example, six transistors, are arrayed in rows and columns. These memory cells are connected to a plurality of word lines extended in a row direction and to a plurality of pairs of bit lines extended in a column direction. The transistors paired to constitute each memory cell are cross connected and connected to the bit lines. In addition, nodes of these transistors are connected to a pair of switching transistors, which are connected to the word line.

When a large number of memory cells are connected to a pair of bit lines in the column direction, the bit lines are loaded with capacitance. Accordingly, a sense amplifier amplifies very small amplitude of an output signal from the selected pair of bit lines, in order to read out data stored in the selected memory cell.

The sense amplifier is required to have a sufficiently low input offset, in order to sense the very small amplitude for high-speed readout operation. In order to achieve this, an area of the sense amplifier must be enlarged.

However, an influence of the dispersion of characteristics of each element becomes more serious as the devices are miniaturized. As a result, it is gradually becoming difficult to produce a sense amplifier with a sufficiently small input offset.

Thus, instead of sensing the very small amplitude, it is considered to reduce the number of the memory cells connected to each pair of bit lines in the column direction, to lighten the capacitive load of the bit lines. For this purpose, the bit lines are divided in the column direction to read out data from each divided pair of the bit lines.

In an SRAM of single-end sensing type, each memory cell is connected to a pair of local bit lines. Furthermore, the pair of local bit lines is connected to a pair of global bit lines through switching transistors. One of the pair of local bit lines is connected to a sense amplifier to be used for single-end sensing.

For example, the sense amplifier to be used for the single-end sensing includes an inverter circuit connected to the local bit lines, and an n-channel transistor having a gate connected to the inverter circuit. Such an SRAM is referred to as single-end sensing type.

The switching transistors of the memory cell are conductive by be setting the word lines to level 1 to read out data. Accordingly, the memory cell is electrically coupled with the pair of local bit lines. In an SRAM of the single-end sensing type, capacitance of each pair of local bit lines is sufficiently low. Therefore, data stored in the memory cell can be outputted by increasing the electric potential of one of the pair of local bit lines in full range from earthed potential (0V) to power supply potential (VDD).

Accordingly, when reading out data stored in the memory cell, the signal from the memory cell can be sufficiently amplified by a logic gate such as an inverter circuit to sense the data.

In the case where the output of one of the selected pair of local bit lines is level 0, the n-channel transistors of the sense amplifier are conductive, and global bit lines are forced to be level 0 when reading out the data from the memory cell.

On the contrary, when the output of one of the selected pair of local bit lines is level 1, the n-channel transistors of the sense amplifier are nonconductive. Since the initial settings of the global bit lines are pulled up, level 1 is outputted from the global bit lines.

As described above, it is unnecessary to provide a sense amplifier with an input offset reduced by enlarging its area in the SRAM of the single-end sensing type, unlike normal SRAMs. Thus, it is possible to substitute a logic gate such as an NAND circuit or an inverter circuit with a small area for a sense amplifier as described in Kevin Zhang, Ken Hose, Vivek De, and Borys Senyk et al, "The Scaling of Data Sensing Schemes for High Speed Cache Design in Sub-0.18 $\mu$m Technologies," 2000 symposium on VLSI Circuits Digest of Technical Papers, P.226–227.

To write data into the SRAM of the single-end sensing type, one of the pulled-up pair of local bit lines connected to the memory cell becomes level 0. As a result, each pair of the global bit lines is required to exist for each pair of the local bit lines.

A plurality of these pairs of global bit lines are usually wired by use of upper layer metal. When a large number of the global bit lines are wired, pitches are reduced between the lines. Accordingly, capacitance is increased between the lines. Furthermore, to prevent the pitches between the lines from reducing, widths between the lines may be narrowed. However, resistance of the lines themselves increases.

These factors incur increase in wiring delay in the global bits lines and reduce the operation speed.

SUMMARY OF THE INVENTION

One aspect of the static semiconductor storage device of the present invention comprises:
  a plurality of word lines extended in a row direction;
  a plurality of first bit lines extended in a column direction, the plurality of first bit lines including i-th, j-th and k-th first bit lines (i, j and k are different arbitrary positive integers);
  a plurality of pairs of second bit lines extended in the column direction, the second bit lines including i-th, j-th and k-th pairs of second bit lines respectively corresponding to the first bit lines;
  a plurality of memory cells respectively arrayed in the row and column directions and connected to the word lines by each row and to the pairs of second bit lines by each column, each of the memory cells having a plurality of transistors cross connected;
  a plurality of sense amplifiers being used for single-end sensing, each of the sense amplifiers having an input terminal connected to one of each pair of the second bit lines, and having an output terminal connected to each of the first bit lines;

a plurality of pairs of write column switches respectively connected between the first bit lines and the pairs of second bit lines, the write column switches including an i-th pair of write column switches connected between the i-th first bit line and one of the i-th pair of the second bit lines corresponding to the i-th first bit line, and between the j-th first bit line and the other of the i-th pair of the second bit lines and the write column switches further including a j-th pair of write column switches connected between the j-th first bit line and one of the j-th pair of the second bit lines corresponding to the j-th first bit line, and between the k-th first bit line and the other of the j-th pair of the second bit lines; and a write controller to control conduction of the plurality of pairs of the write column switches, the write controller including a write controller to control the i-th pair of write column switches and the j-th pair of write column switches to be conductive at different times.

Another aspect of the static semiconductor storage device of the present invention comprises:

a plurality of word lines extended in a row direction;

a plurality of first bit lines extended in a column direction, the plurality of first bit lines including i-th, j-th and k-th first bit lines (i, j and k are different arbitrary positive integers);

a plurality of pairs of second bit lines extended in the column direction, the second bit lines including P-th and Q-th (P and Q are different arbitrary positive integers) pairs of second bit lines corresponding to a set of the i-th and j-th first bit lines, and R-th and S-th (R and S are different arbitrary positive integers) pairs of second bit lines corresponding to a set of the j-th and k-th first bit lines;

a plurality of memory cells respectively arrayed in the row and column directions and connected to the word lines by each row and to the pairs of second bit lines by each column, each of the memory cells having a plurality of transistors cross connected;

P-th to S-th sense amplifiers being used for single-end sensing, each of the sense amplifiers having an input terminal connected to one of each pair of the second bit lines;

a plurality of column selection switches respectively connected between the sense amplifiers and the first bit lines, the column selection switches including P-th and Q-th column selection switches respectively connected between output terminals of the P-th and Q-th sense amplifiers and the i-th first bit line, and the column selection switches further including R-th and S-th column selection switches respectively connected between output terminals of the R-th and S-th sense amplifiers and the j-th first bit line;

a plurality of pairs of write column switches respectively connected between the first bit lines and the pairs of second bit lines, the write column switches including a P-th pair of write column switches connected between the i-th first bit line and one of the P-th pair of the second bit lines and between the j-th first bit line and the other of the P-th pair of the second bit lines, and the write column switches further including a Q-th pair of write column switches connected between the i-th first bit line and one of the Q-th pair of the second bit lines and between the j-th first bit line and the other of the Q-th pair of the second bit lines, the write column switches further includig an R-th pair of write column switches connected between the j-th first bit line and one of the R-th pair of the second bit lines and between the k-th first bit line and the other of the R-th pair of the second bit lines, and the write column switches yet further including an S-th pair of write column switches connected between the j-th first bit line and one of the S-th pair of the second bit lines and between the k-th first bit line and the other of the S-th pair of the second bit lines;

a write controller to control conduction of the plurality of pairs of write column switches, the write controller including a write controller which controls the P-th and Q-th pairs of write column switches and the R-th and S-th pairs of write column switches to be conductive at different times; and a column selection controller to control conduction of the plurality of column selection switches, the column selection controller including a column selection controller which controls the P-th and Q-th pairs of column selection switches to be conductive at different times, and controls the R-th and S-th column selection switches to be conductive at different

DETAILED DESCRIPTION OF THE INVENTION

Embodiments of the present invention are described below with reference to the drawings.

Figure 1:
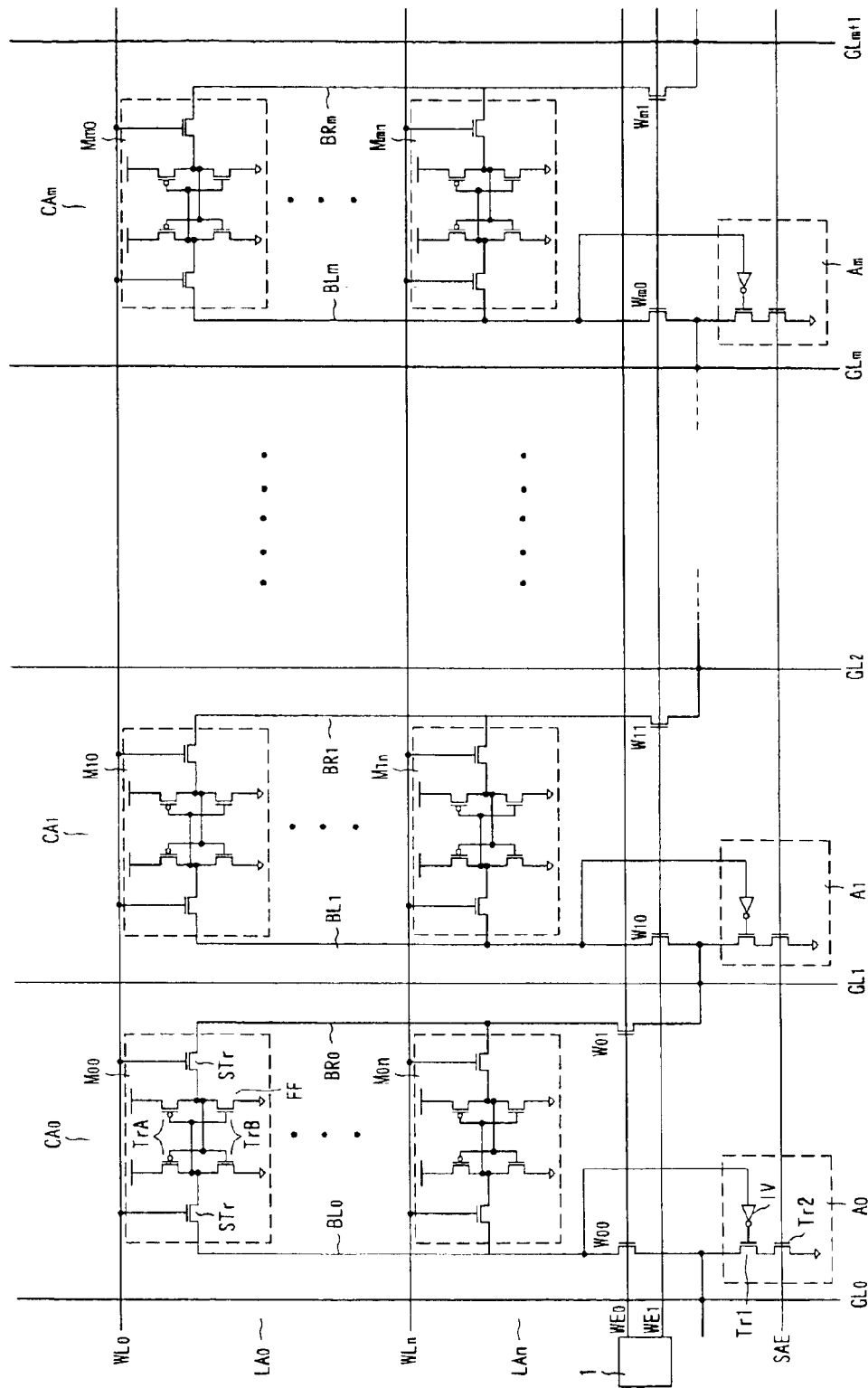
FIG. 1 is a diagram showing the circuitry of an SRAM of the single-end sensing type according to a first embodiment of the present invention.

FIG. 1 shows the circuitry of an SRAM of a single-end sensing type according to a first embodiment of the present invention.

A plurality of memory cells $M_{00}$ to $M_{mn}$ are arrayed in rows and columns on a semiconductor substrate (not shown). These memory cells $M_{00}$ to $M_{mn}$ are disposed at each intersection of rows. $LA_0$ to $LA_n$ and columns $CA_0$ to $CA_m$. The symbols m and n are positive integers of 1 or more.

On the semiconductor substrate, a plurality of word lines $WL_0$ to $WL_n$ are provided in a row direction. An insulating layer is interposed between the word lines and the semiconductor substrate. A plurality of local bit lines $BL_0$ to $BL_m$ and $BR_0$ to $BR_m$, which are paired respectively, are provided in a column direction. Moreover, in the column direction, a plurality of global bit lines $GL_0$ to $GL_{m+1}$ are provided.

From the left part of the diagram, a memory cell group $M_{00}$ to $M_{0n}$ to a memory cell group $M_{m0}$ to $M_{mn}$ are disposed between and connected to the pairs of local bit lines $BL_0$ to $BL_m$ and $BR_0$ to $BR_m$, respectively. These pairs of local bit lines $BL_0$ to $BL_m$ and $BR_0$ to $BR_m$ are pulled up before readout.

Each memory cell $M_{00}$ to $M_{mn}$ includes a flip-flop circuit FF and two n-channel switching transistors STr. Two p-channel transistors TrA and two n-channel transistors TrB constitute the flip-flop circuit FF.

Gate electrodes of switching transistors STr of each memory cell $M_{00}$ to $M_{mn}$ are connected to word lines $WL_0$ to $WL_n$, respectively. Switching transistors STr are conductive when the word lines are at level 1, and switching transistors STr are nonconductive when the word lines are at level 0.

Local bit lines $BL_0$ to $BL_m$ are connected to input terminals of single-ended sense amplifiers $A_0$ to $A_m$, respectively. Output terminals of these single-ended sense amplifiers $A_0$ to $A_m$, are connected to global bit lines $GL_0$ to $GL_m$, respectively. The global bit lines are pulled up before readout.

Each single-ended sense amplifier $A_0$ to $A_m$ includes one inverter circuit IV and first and second n-channel transistors Tr1 and Tr2.

Input signals from local bit lines $BL_0$ to $BL_m$ are supplied to inverter circuit IV of each sense amplifier $A_0$ to $A_m$. The outputs of these inverter circuits IV are supplied to gate electrodes of first n-channel transistors Tr1. Drain electrodes of first n-channel transistors Tr1 are connected to global bit lines $GL_0$ to $GL_m$, respectively. Source electrodes of first n-channel transistors Tr1 are connected to drain electrodes of second n-channel transistors Tr2. Source electrodes of second n-channel transistors Tr2 are earthed, and gate electrodes of second n-channel transistors Tr2 are supplied with an SAE signal.

When the SAE signal is level 1, second n-channel transistors Tr2 becomes conductive. Accordingly, single-ended sense amplifiers $A_0$ to $A_m$ are enabled.

Herein, when local bit lines $BL_0$ to $BL_m$ are at level 0, the output of inverter circuit IV of each sense amplifier $A_0$ to $A_m$ is at level 1. As a result, first n-channel transistors Tr1 become conductive. Thus, level 0 is read out from global bit lines $GL_0$ to $GL_m$.

On the other hand, when local bit lines $BL_0$ to $BL_m$ are at level 1, the output of inverter circuit IV of each sense amplifier $A_0$ to $A_m$ is at level 0. As a result, first n-channel transistors Tr1 become nonconductive. Thus, level 1 is read out from pulled-up global bit lines $GL_0$ to $GL_m$.

Write column switches $W_{00}$ to $W_{m0}$ are connected between local bit lines $BL_0$ to $BL_m$ and global bit lines $GL_0$ to $GL_m$.

Furthermore, local bit lines $BR_0$ to $BR_m$ are connected to global bit lines $GL_1$ to $GL_{m+1}$ located in the right adjacency in FIG. 1, through write column switches $W_{01}$ to $W_{m1}$.

A write controller 1 controls the pairs of write column switches $W_{00}$ to $W_{m0}$ and $W_{01}$ to $W_{m1}$ to be conductive at different times. For example, a pair of write column switches $W_{00}$ and $W_{01}$ in column $CA_0$ and a pair of write column switches $W_{10}$ and $W_{11}$ in column $CA_1$ are controlled to be conductive at different times.

More specifically, gate electrodes of write column switches $W_{10}$ and $W_{11}$ in column $CA_1$ are supplied with the least significant bit signal $WE_1$ of a column address given from the outside, write controller 1. In addition, input signal $WE_0$, the inversion of signal $WE_1$, is supplied to gate electrodes of write column switches $W_{00}$ and $W_{01}$ in column $CA_0$.

When a selected column is even, signals $WE_1$ and $WE_0$ become level 0 and 1, respectively. On the contrary, when a selected column is odd, signals $WE_1$ and $WE_0$ become level 1 and 0, respectively. In this way, it is possible to control the write column switches in the adjacent column to conduct alternately without fail.

Next, when writing data into memory cell $M_{00}$ at column $CA_0$ and row $LA_0$, word line $WL_0$ is set to level 1 to make switching transistors STr of memory cell $M_{00}$ conductive.

Since the least significant bit of the column address given from the outside, write controller 1, is 0, signal $WE_0$ becomes level 1, and a pair of write column switches $W_{00}$ and $W_{01}$ become conductive.

Consequently, global bit line $GL_0$ and memory cell $M_{00}$ are connected through local bit line $BL_0$.

Moreover, global bit line $GL_1$ and memory cell $M_{00}$ are connected through local bit line $BR_0$.

A pair of write column switches $W_{10}$ and $W_{11}$ becomes nonconductive because signal $WE_1$ is at level 0. Thus, global bit line $GL_1$ is not connected to a memory group $M_{10}$ and $M_{1n}$.

Accordingly, to write data into memory cell $M_{00}$, a level of either pulled-up global bit line $GL_0$ or global bit line $GL_1$ is reduced so that levels of a pair of local bit lines $BL_0$ and $BR_0$ can be controlled to write data.

When global bit line $GL_0$ becomes level 0, local bit line $BL_0$ becomes level 0, and level 0 is stored in memory cell $M_{00}$. On the other hand, when global bit line $GL_1$ becomes level 0, local bit line $BR_0$ becomes level 0, and level 1 is stored in memory cell $M_{00}$.

The signals supplied to the gate electrodes of write column switches $W_{00}$ to $W_{m1}$ are not limited the least significant bit signal of the column address given from the outside as described in the present embodiment. Write controller 1 may produce the signals to control adjacent pairs of the write column switches to be conductive at different times.

As described above, local bit lines $BL_0$ to $BL_m$ and $BR_0$ to $BR_m$ which are paired respectively, and adjacent pairs of global bit lines $GL_0$ to $GL_{m+1}$, are used for the memory cell groups in columns $CA_0$ to $CA_m$. Data stored in memory cells $M_{00}$ to $M_{mn}$ can be effectively read out at global bit lines $GL_0$ to $GL_m$ from local bit lines $BL_0$ to $BL_m$ through sense amplifiers $A_0$ to $A_m$.

When writing data into memory cells $M_{00}$ to $M_{mn}$, global bit line connected to a selected memory cell and global bit line connected to the memory cell in the adjacent column are employed. Thus, a desirable data can be written into the selected memory cell.

By sharing the global bit lines, it is possible to reduce the number of global bit lines. In other words, the number of the wired global bit lines is approximately half of that in a conventional semiconductor storage device, and it is possible to make pitches between the global bit lines larger than those between the local bit lines. Moreover, capacitance or resistance per unit length of the global bit lines is reduced, so that high-speed operation of a semiconductor memory device is enabled.

Figure 2:
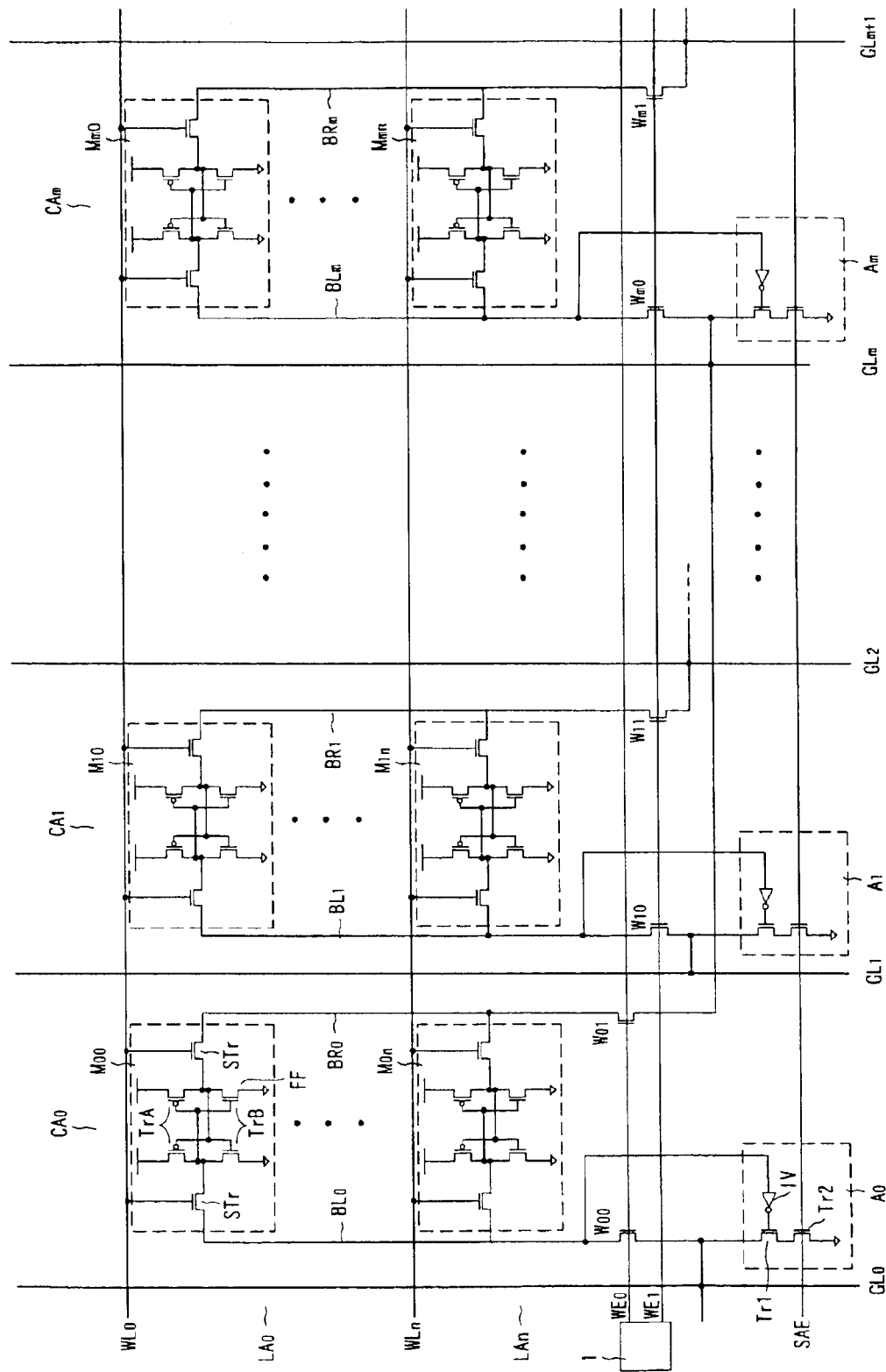
FIG. 2 is a diagram showing the circuitry of an SRAM of the single-end sensing type according to a second embodiment of the present invention.

FIG. 2 shows the circuitry of an SRAM of the single-end sensing type according to a second embodiment of the present invention. The SRAM of the single-end sensing type in the second embodiment is a modification example of that in the first embodiment. Local bit lines $BR_0$ to $BR_m$ are connected to the global bit lines in the nonadjacent columns.

Similar to the first embodiment, the second embodiment is provided with memory cells $M_{00}$ to $M_{mn}$, a plurality of paired local bit lines $BL_0$ to $BL_m$ and $BR_0$ to $BR_m$, a plurality of global bit lines $GL_0$ to $GL_m$, single-ended sense amplifiers $A_0$ to $A_m$, write column switches $W_{00}$ to $W_{m1}$ and word lines $WL_0$ to $WL_n$.

For example, as shown in FIG. 2, global bit line $GL_m$ connected to local bit line $BR_0$ through write column switch $W_{01}$ is not a global bit line of right adjacent column $CA_1$, but is located in remote column $CA_m$ in the present embodiment (symbol m is a positive number of 2 or more).

Signals generated at write controller 1 control the pair of write column switches $W_{00}$ and $W_{01}$ in column $CA_0$ and the pair of write column switches $W_{m0}$ and $W_{m1}$ in column $CA_m$ to be conductive at different times.

For instance, when writing data into memory cell $M_{00}$, a pair of write column switches $W_{00}$ and $W_{01}$ in column $CA_0$ is set to be conductive, and a pair of write column switches $Wm_0$ and $W_{m1}$ in column $CA_m$ is set to be nonconductive.

As a result, global bit line $GL_0$ and memory cell $M_{00}$ are connected through local bit line $BL_0$. Moreover, global bit line $GL_m$ and memory cell $M_{00}$ are connected through local bit line $BR_0$.

Accordingly, by setting global bit line $GL_0$ being at level 0 and maintaining the level of global bit line $GL_m$ at a pulled-up level, local bit line $BL_0$ becomes level 0, and level 0 is stored in memory cell $M_{00}$. In addition, by maintaining the level of global bit line $GL_0$ at the pulled-up level and setting the global bit line $GL_m$ being at level 0, local bit line $BR_0$ becomes level 0, and level 1 is stored in memory cell $M_{00}$.

As described above, although local bit line $BR_0$ is not connected to adjacent global bit line $GL_1$ but to global bit line $GL_m$, it is possible to write data into memory cell $M_{00}$.

Thus, similar to the first embodiment, the number of the wired global bit lines is approximately half of that in the conventional semiconductor memory device. Consequently, pitches between the global bit lines can be larger than those between the local bit lines. Furthermore, capacitance or resistance per unit length of the global bit lines is reduced, so that the high-speed operation of the semiconductor storage device is enabled.

The local bit lines in other columns, besides the aforementioned column $CA_0$, may also be connected to nonadjacent and remote global bit lines through the write column switches.

Figure 3:
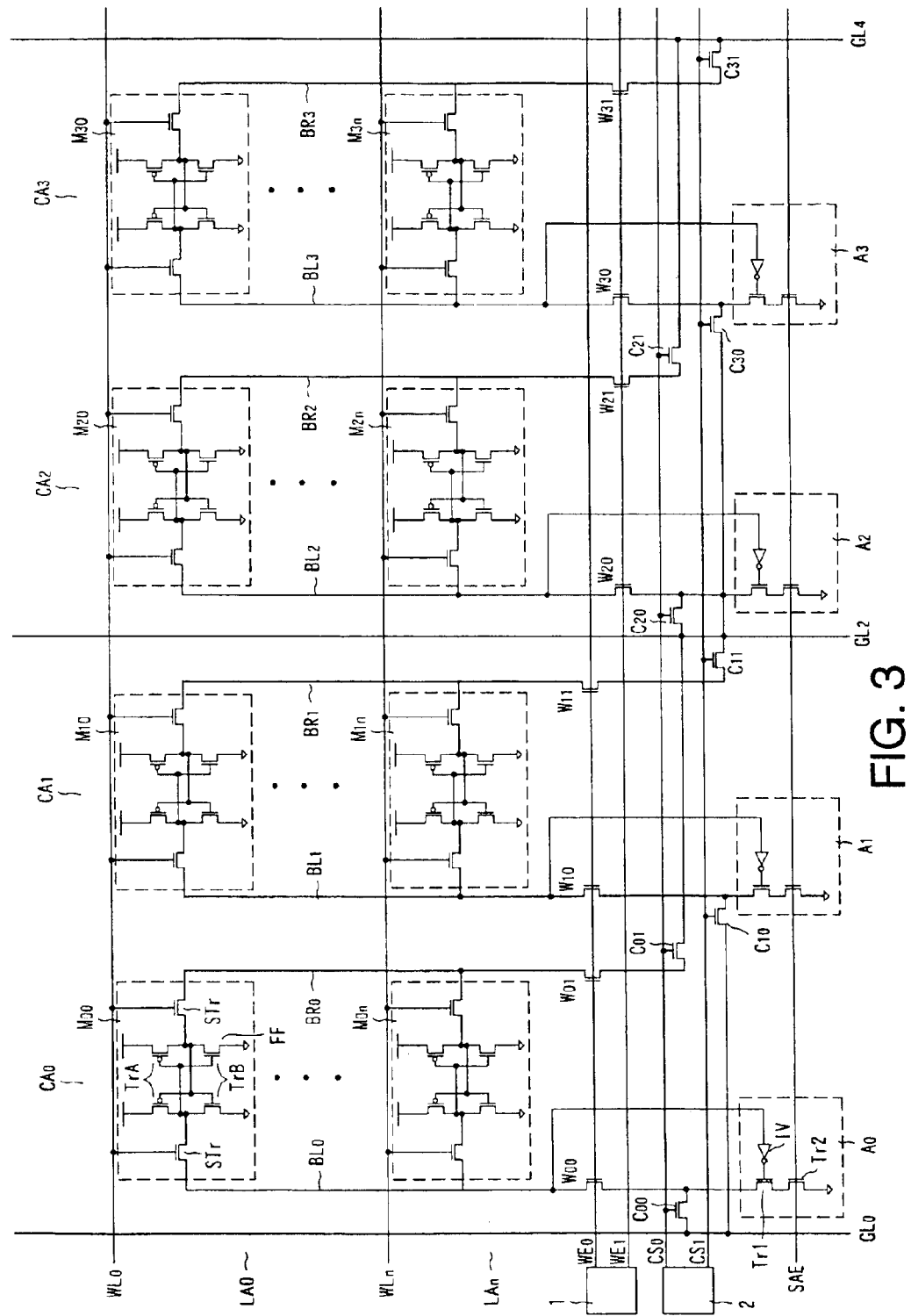
FIG. 3 is a diagram showing a representative part of the circuitry of an SRAM of the single-end sensing type according to a third embodiment of the present invention.

FIG. 3 shows a representative part of the circuitry of an SRAM of the single-end sensing type according to a third embodiment of the present invention.

Similar to the first embodiment, memory cells $M_{00}$ to $M_3$, in respective columns $CA_0$ to $CA_3$ are connected to paired local bit lines $BL_0$ to $BL_3$ and $BR_0$ to $BR_3$. The gate electrodes of switching transistors STr constituting each memory cell are connected to word lines $WL_0$ to $WL_n$.

Each local bit lines $BL_0$ to $BL_3$ are connected to input terminals of single-ended sense amplifiers $A_0$ to $A_3$, respectively.

Output terminals of single-ended sense amplifiers $A_0$ and $A_1$ are connected to global bit line $GL_0$ through column selection switches $C_{00}$ and $C_{10}$, respectively. Furthermore, the output terminals of single-ended sense amplifiers $A_2$ and $A_3$ are connected to global bit line $GL_2$ through column selection switches $C_{20}$ and $C_{30}$, respectively.

On the left side of FIG. 3, write column switch $W_{00}$ and column selection switch $C_{00}$ are connected between local bit line $BL_0$ and global bit line $GL_0$. Moreover, write column switch $W_{10}$ and column selection switch $C_{10}$ are connected between adjacent local bit line $BL_1$ and global bit line $GL_0$.

On the left side of FIG. 3, local bit line $BR_0$ is connected to global bit line $GL_2$ through write column switch $W_{01}$ and column selection switch $C_{01}$. In addition, adjacent local bit line $BR_1$ is connected to global bit line $GL_2$ through write column switch $W_{11}$ and column selection switch $C_{11}$.

On the right side of FIG. 3, write column switch $W_{20}$ and column selection switch $C_{20}$ are connected between local bit line $BL_2$ and global bit line $GL_2$. Furthermore, write column switch $W_{30}$ and column selection switch $C_{30}$ are connected between adjacent local bit line $BL_3$ and global bit line $GL_2$.

Moreover, local bit line $BR_2$ on the right side of FIG. 3 is connected to global bit line $GL_4$ through write column switch $W_{21}$, and column selection switch $C_{21}$. In addition, adjacent local bit line $BR_3$ is connected to global bit line $GL_4$ through write column switch $W_{31}$ and column selection switch $C_{31}$.

As described above, global bit line $GL_0$ is shared by memory cells $M_{00}$ to $M_{0n}$ and $M_{10}$ to $M_{1n}$ located in two columns $CA_0$ and $CA_1$. Accordingly, a column of the memory cells, which data is read out from or written into, is selected by inserting a write column switch and a column selection switch between global bit line $GL_0$ and local bit line $BL_0$, and between global bit line $GL_0$ and local bit line $BL_1$, respectively.

Moreover, local bit lines $BR_0$ and $BR_1$ in columns $CA_0$ and $CA_1$ are connected to global bit line $GL_2$ through the write column switches and the column selection switch. This global bit line $GL_2$ is shared by memory cells $M_{20}$ to $M_{2n}$ and $M_{30}$ to $M_{3n}$ located in other columns $CA_2$ and $CA_3$. A column of the memory cells, which data is read out from or written into, is selected by inserting a write column switch and a column selection switch between global bit line $GL_2$ and local bit line $BL_2$ in column $CA_2$, and between global bit line $GL_2$ and local bit line $BL_3$ in column $CA_3$, respectively.

In other words, global bit line $GL_2$ is shared by memory cells $M_{00}$ to $M_{0n}$, $M_{10}$ to $M_{1n}$, $M_{20}$ to $M_{2n}$ and $M_{30}$ to $M_{3n}$ located in the respective four columns $CA_0$, $CA_1$, $CA_2$ and $CA_3$.

A column selection signal $CS_0$ is supplied to gate electrodes of a pair of column selection switches $C_{00}$ and $C_{01}$ in column $CA_0$. Moreover, a column selection signal $CS_1$ is supplied to gate electrodes of a pair of column selection switches $C_{10}$ and $C_{11}$ in column $CA_1$.

In FIG. 3, n-channel transistors constitute column selection switches $C_{00}$ to $C_{31}$. A signal generated at a column selection controller 2 controls column selection signals $CS_0$ and $CS_1$ so as not to be at level 1 simultaneously. When selecting a memory cell in column $CA_0$, $CS_0$ is set to be at level 1, and $CS_1$ is set to be at level 0. When selecting a memory cell in column $CA_1$, $CS_0$ is set to be at level 0, and $CS_1$ is set to be at level 1. For example, when the least significant bit signal of the column address given from the outside of column selection controller 2 is set as $CS_1$ and the inverted signal of CS1 is set as $CS_0$, it is possible to control column selection switches $C_{00}$ to $C_{31}$.

Furthermore, memory cells $M_{20}$ to $M_{2n}$ and $M_{30}$ to $M_{3n}$ located in adjacent columns $CA_2$ and $CA_3$ are similarly connected to single-ended sense amplifiers $A_2$ and $A_3$, respectively. Memory cells $M_{20}$ to $M_{2n}$ and $M_{30}$ to $M_{3n}$ are also connected to a pair of local bit lines $BL_2$ and $BR_2$ and a pair of local bit lines $BL_3$ and $BR_3$, respectively.

Write column switch $W_{20}$ is connected between single-ended sense amplifier $A_2$ and local bit line $BL_2$ in column $CA_2$.

Moreover, write column switch $W_{30}$ is connected between single-ended sense amplifier $A_3$ and local bit line $BL_3$ in adjacent column $CA_3$.

Further, local bit line $BR_2$ in column $CA_2$ is connected to global bit line $GL_4$ through write column switch $W_{21}$ and column selection switch $C_{21}$.

Furthermore, local bit line $BR_3$ in column $CA_3$ is connected to global bit line $GL_4$ through write column switch $W_{31}$ and column selection switch $C_{31}$.

Column selection controller 2 supplies a pair of column selection switches $C_{20}$ and $C_{21}$ with a column selection signal $CS_0$. In addition, column selection controller 2 supplies a pair of column selection switches $C_{30}$ and $C_3$, with a column selection signal $CS_1$.

The gate electrodes of a pair of write column switches $W_{00}$ and $W_{01}$ in column $CA_0$ and a pair of write column switches $W_{10}$ and $W_{11}$ in column $CA_1$ are supplied with inverted signals $WE_0$ of the second least significant bit signals of column addresses given from the outside of write controller 1. The gate electrodes of a pair of write column switches $W_{20}$ and $W_{21}$ in column $CA_2$ and a pair of write column switches $W_{30}$ and $W_{31}$ in column $CA_3$ are supplied with the second least significant bit signals $WE_1$ of the column addresses given from the outside of write controller 1. Thus, the write column switches in columns $CA_0$ and $CA_1$ and the write column switches in columns $CA_2$ and $CA_3$ become conductive alternately.

When writing data into memory cell $M_{00}$ at column $CA_0$ and row $LA_0$, word line $WL_0$ is set to level 1 to switch transistors STr of memory cell $M_{00}$ to be conductive.

Since the second least significant bit of the column address given from the outside is 0, signal $WE_0$ is set to level 1. Accordingly, a pair of write column switches $W_{00}$ and $W_{01}$ become conductive.

As a result, global bit line $GL_0$ and memory cell $M_{00}$ are connected through local bit line $BL_0$ in column $CA_0$.

Furthermore, global bit line $GL_2$ and memory cell $M_{00}$ are connected through local bit line $BR_0$ in column $CA_0$.

Write column switches $W_{20}$, $W_{21}$, $W_{30}$ and $W_{31}$ are nonconductive because signal $WE_1$ is at level 0. Hence, global bit line $GL_2$ is not connected to memory cells $M_{20}$ to $M_{2n}$ and $M_{30}$ to $M_{3n}$ in columns $CA_2$ and $CA_3$.

Thus, to write data into memory cell $M_{00}$, either global bit line $GL_0$ or $GL_2$ is set to be at level 0. Consequently, levels of a pair of local bit lines $BL_0$ and $BR_0$ in column $CA_0$ can be controlled.

When global bit line $GL_0$ is set to be at level 0, local bit line $BL_0$ becomes level 0, and level 0 is stored in memory cell $M_{00}$. Meanwhile, when global bit line $GL_2$ is set to be at level 0, local bit line $BR_0$ in column $CA_0$ becomes level 0, and level 1 is stored in memory cell $M_{00}$.

The same steps are applied when writing data into a memory cell in other column.

In the third embodiment, global bit line $GL_2$ is shared by four pairs of local bit lines in the present embodiment. However, the number of the pairs is not limited to this. Five or more pairs of local bit lines may share one global bit line. In this case, division of time that the global bit line is used by each pair of local bit lines is required to be increased.

In the present embodiment, three global bit lines are sufficient for memory cells in four or more columns. Thus, it is possible to reduce the number of the wired global bit lines further than the aforementioned first and second embodiments.

Accordingly, pitches between the wired global bit lines can be further increased. Moreover, capacitance or resistance per unit length of the global bit lines is reduced so that the high-speed operation of the semiconductor storage device is enabled.

Although the case of four columns $CA_0$ to $Ca_3$ is shown in FIG. 3, it is possible to increase the number of the columns by forming the same circuitry repeatedly.

As previously mentioned in the first to third embodiments, control signals for write column switches or column selection switches are generated from a column address given from the outside. However, the signals are not limited to this. It is also possible to control the write column switches and the column selection switches by other signals.

Moreover, the constituents of the memory cell are not limited to six transistors. For example, two resistors and two transistors may constitute a flip-flop circuit, and a pair of transistors may be cross connected in a memory cell.

Furthermore, positional relationships between the pairs of local bit lines and the global bit lines may be formed on the same wiring layer or different wiring layers in a semiconductor substrate. When positional relationships between the local bit lines and the global bit lines are formed on different wiring layers, it is possible to increase the pitches between the lines. Therefore, effects of the present invention can be further obtained.

Numerous modifications and variations of the present invention are possible in light of the above teachings. It is therefore to be understood that, within the scope of the appended claims, the present invention can be practiced in a manner other than as specifically described herein.

What is claimed is:

1. A static semiconductor storage device comprising:
   a plurality of word lines extended in a row direction;
   a plurality of first bit lines extended in a column direction, the plurality of first bit lines including i-th, j-th and k-th first bit lines (i, j and k are different arbitrary positive integers);
   a plurality of pairs of second bit lines extended in the column direction, the second bit lines including i-th, j-th and k-th pairs of second bit lines respectively corresponding to the first bit lines;
   a plurality of memory cells respectively arrayed in the row and column directions and connected to the word lines by each row and to the pairs of second bit lines by each column, each of the memory cells having a plurality of transistors cross connected;
   a plurality of sense amplifiers being used for single-end sensing, each of the sense amplifiers having an input terminal connected to one of each pair of the second bit lines, and having an output terminal connected to each of the first bit lines;
   a plurality of pairs of write column switches respectively connected between the first bit lines and the pairs of second bit lines, the write column switches including an i-th pair of write column switches connected between the i-th first bit line and one of the i-th pair of the second bit lines corresponding to the i-th first bit line, and between the j-th first bit line and the other of the i-th pair of the second bit lines and the write column switches further including a j-th pair of write column switches connected between the j-th first bit line and one of the j-th pair of the second bit lines corresponding to the j-th first bit line, and between the k-th first bit line and the other of the j-th pair of the second bit lines; and
   a write controller to control conduction of the plurality of pairs of the write column switches, the write controller including a write controller to control the i-th pair of write column switches and the j-th pair of write column switches to be conductive at different times.

2. A static semiconductor storage device comprising:
   a plurality of word lines extended in a row direction;
   a plurality of first bit lines extended in a column direction, the plurality of first bit lines including i-th, j-th and k-th first bit lines (i, j and k are different arbitrary positive integers);

a plurality of pairs of second bit lines extended in the column direction, the second bit lines including P-th and Q-th (P and Q are different arbitrary positive integers) pairs of second bit lines corresponding to a set of the i-th and j-th first bit lines, and R-th and S-th (R and S are different arbitrary positive integers) pairs of second bit lines corresponding to a set of the j-th and k-th first bit lines;

a plurality of memory cells respectively arrayed in the row and column directions and connected to the word lines by each row and to the pairs of second bit lines by each column, each of the memory cells having a plurality of transistors cross connected;

P-th to S-th sense amplifiers being used for single-end sensing, each of the sense amplifiers having an input terminal connected to one of each pair of the second bit lines;

a plurality of column selection switches respectively connected between the sense amplifiers and the first bit lines, the column selection switches including P-th and Q-th column selection switches respectively connected between output terminals of the P-th and Q-th sense amplifiers and the i-th first bit line, and the column selection switches further including R-th and S-th column selection switches respectively connected between output terminals of the R-th and S-th sense amplifiers and the j-th first bit line;

a plurality of pairs of write column switches respectively connected between the first bit lines and the pairs of second bit lines, the write column switches including a P-th pair of write column switches connected between the i-th first bit line and one of the P-th pair of the second bit lines and between the j-th first bit line and the other of the P-th pair of the second bit lines, and the write column switches further including a Q-th pair of write column switches connected between the i-th first bit line and one of the Q-th pair of the second bit lines and between the j-th first bit line and the other of the Q-th pair of the second bit lines, the write column switches further includig an R-th pair of write column switches connected between the j-th first bit line and one of the R-th pair of the second bit lines and between the k-th first bit line and the other of the R-th pair of the second bit lines, and the write column switches yet further including an S-th pair of write column switches connected between the j-th first bit line and one of the S-th pair of the second bit lines and between the k-th first bit line and the other of the S-th pair of the second bit lines;

a write controller to control conduction of the plurality of pairs of write column switches, the write controller including a write controller which controls the P-th and Q-th pairs of write column switches and the R-th and S-th pairs of write column switches to be conductive at different times; and a column selection controller to control conduction of the plurality of column selection switches, the column selection controller including a column selection controller which controls the P-th and Q-th pairs of column selection switches to be conductive at different times, and controls the R-th and S-th column selection switches to be conductive at different time.

3. The static semiconductor storage device according to claim 1, wherein the i-th and j-th first bit lines are complementary data lines of the memory cells connected to the i-th pair of second bit lines, and the j-th and k-th first bit lines are complementary data lines of the memory cells connected to the j-th pair of second bit lines.

4. The static semiconductor storage device according to claim 2, wherein the i-th and j-th first bit lines are complementary data lines of the memory cells connected to the P-th and Q-th pairs of second bit lines, and the J-th and k-th first bit lines are complementary data lines of the memory cells connected to the R-th and S-th pairs of second bit lines.

5. The static semiconductor storage device according to claim 1, wherein the sense amplifiers are constituted by logic gates.

6. The static semiconductor storage device according to claim 2, wherein the sense amplifiers are constituted by logic gates.

7. The static semiconductor storage device according to claim 1, wherein at least two of the i-th to k-th first bit lines are adjacent to each other.

8. The static semiconductor storage device according to claim 2, wherein at least two of the i-th to k-th first bit lines are adjacent to each other.

9. The static semiconductor storage device according to claim 1, wherein the j-th first bit line is adjacent to both the i-th and k-th first bit lines.

10. The static semiconductor storage device according to claim 2, wherein the j-th first bit line is adjacent to both the i-th and k-th first bit lines.

11. The static semiconductor storage device according to claim 1, wherein an l-th (l is a positive integer different from i and j) first bit line is disposed between the i-th first bit line and the j-th first bit line.

12. The static semiconductor storage device according to claim 2, wherein an l-th (l is a positive integer different from i and j) first bit line is disposed between the i-th first bit line and the j-th first bit line.

13. The static semiconductor storage device according to claim 1, wherein a wiring layer of the first bit lines is different from a wiring layer of the second bit lines.

14. The static semiconductor storage device according to claim 2, wherein a wiring layer of the first bit lines is different from a wiring layer of the second bit lines.

15. The static semiconductor storage device according to claim 1, wherein resistance per unit length of the first bit lines is lower than that of the second bit lines.

16. The static semiconductor storage device according to claim 2, wherein resistance per unit length of the first bit lines is lower than that of the second bit lines.

17. The static semiconductor storage device according to claim 1, wherein capacitance per unit length of the first bit lines is lower than that of the second bit lines.

18. The static semiconductor storage device according to claim 2, wherein capacitance per unit length of the first bit lines is lower than that of the second bit lines.

19. The static semiconductor storage device according to claim 1, wherein the write controller generates a predetermined bit signal of a column address and an inversion signal of the bit signal.

20. The static semiconductor storage device according to claim 2, wherein the write controller generates a predetermined bit signal of a column address and an inversion signal of the bit signal.

21. The static semiconductor storage device according to claim 1, wherein the column selection controller generates a predetermined bit signal of a column address and an inversion signal.

22. The static semiconductor storage device according to claim 2, wherein the column selection controller generates a signal of a column address and an inversion signal of the bit signal.

* * * * *